United States Patent
Tanahashi et al.

(10) Patent No.: US 7,906,443 B2
(45) Date of Patent: Mar. 15, 2011

(54) CONTROLLING OXYGEN PRECIPITATES IN SILICON WAFERS USING INFRARED IRRADIATION AND HEATING

(75) Inventors: Katsuto Tanahashi, Kawasaki (JP); Hiroshi Kaneta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 312 days.

(21) Appl. No.: 11/441,065

(22) Filed: May 26, 2006

(65) Prior Publication Data
US 2007/0190809 A1 Aug. 16, 2007

(30) Foreign Application Priority Data

Feb. 15, 2006 (JP) .................. 2006-038547

(51) Int. Cl.
*H01L 21/00* (2006.01)
*C30B 15/00* (2006.01)
*C30B 21/06* (2006.01)
*C30B 27/02* (2006.01)
*C30B 28/10* (2006.01)
*C30B 30/04* (2006.01)
*B23K 26/00* (2006.01)

(52) U.S. Cl. . 438/795; 117/20; 219/121.6; 257/E21.347
(58) Field of Classification Search .................. 438/795; 117/20; 219/121.6
See application file for complete search history.

(56) References Cited

U.S. PATENT DOCUMENTS
2003/0164139 A1* 9/2003 Kobayashi et al. ............. 117/84
2004/0185680 A1* 9/2004 Hauf et al. ..................... 438/795
2006/0273391 A1* 12/2006 Diaz et al. ..................... 257/335

FOREIGN PATENT DOCUMENTS
JP 10-092761 A 4/1998

OTHER PUBLICATIONS

K. Sueoka, "Modeling of Internal Gettering of Nickel and Copper by Oxide Precipitates in Czochralski-Si Wafers", Journal of Electrochemical Society, 152, pp. G 731-G 735 (2005).
K. Yasutake, M. Umeno, and H. Kawabe, "Mechanical properties of heat-treated Czochralski-grown silicon crystals", Applied Physics Letters, 37, pp. 789-791(1980).
T. Abe and H. Yamada-Kaneta, "Annealing behavior of oxygen in-diffusion from Si $O_2$ film to silicon substrate", Journal of Applied Physics, 96 (2004) pp. 4143-4149.

* cited by examiner

*Primary Examiner* — Matthew C Landau
*Assistant Examiner* — Daniel Luke
(74) *Attorney, Agent, or Firm* — Fujitsu Patent Center (57) ABSTRACT

A wafer processing method is provided that includes the steps of heating a silicon wafer containing oxygen and irradiating an infrared ray having a wavelength within a range of 7-25 μm on the silicon wafer, and controlling formation of oxygen precipitates within the silicon wafer by selectively setting a heating temperature for heating the silicon wafer and an irradiation intensity of the infrared ray.

8 Claims, 8 Drawing Sheets

FIG.8

CONTROLLING OXYGEN PRECIPITATES IN SILICON WAFERS USING INFRARED IRRADIATION AND HEATING

BACKGROUND OF THE INVENTION

1. Field of the Invention

The present invention relates to a method and an apparatus for processing a silicon wafer containing oxygen that involves controlling defect density within the silicon wafer. The present invention particularly relates to a method of processing a silicon wafer that involves suppressing or inducing oxygen precipitation within the silicon wafer, and a method of manufacturing a semiconductor device that uses a silicon wafer that is processed by such a method.

2. Description of the Related Art

Presently, a wafer manufactured through the Czochralski (CZ) method is widely used as a wafer for a silicon device (also referred to as CZ wafer hereinafter).

Generally, a silicon wafer manufactured through the CZ method includes oxygen that is dissolved into growing silicon from quartz crucibles during silicon crystal growth to be incorporated into silicon crystals. In such a silicon wafer, oxygen precipitates (silicon oxide precipitates in single crystal silicon) are generated during the cooling stage of crystal growth and during the heating and cooling stages of a device manufacturing process, for example. It is noted that a strain field (stress field) is generated around the oxygen precipitates owing to their volume difference with the silicon matrix. Such a strain field has an effect of attracting and capturing heavy metal atoms which effect is referred to as intrinsic gettering (simply referred to as gettering hereinafter).

It is noted that heavy metal atoms residing within an active layer of the silicon device may cause leak currents and malfunction of the device. Although cleaning is performed in the device manufacturing process to reduce the heavy metal atoms, the heavy metal atoms are inevitably introduced into the device through the muffle of an oxidation/diffusion furnace, for example. Therefore, gettering by the silicon wafer is necessary (e.g., see K. Sueoka, Journal of Electrochemical Society, 152, G 731, 2005).

A semiconductor integrated circuit may be manufactured by depositing various thin films such as an insulating film, an electrode, wiring, and an interlayer film on a CZ wafer. In this film deposition process, the silicon wafer is heated to a high temperature upon having the films deposited thereon so that heat stress may be generated upon cooling the silicon wafer after the film deposition owing to the difference in the thermal expansion coefficients between the thin films and silicon. It is noted that the silicon wafer may also be heated during processes other than the film deposition process such as an impurity diffusion process. By heating the silicon wafer in the manner described above, a varied temperature distribution especially in the radial direction may be created within the silicon wafer and heat stress may be generated as a result.

It is noted that in most cases, such heat stress includes shear properties that may cause the occurrence of slip and diffusion. A slip generally occurs from a wafer supporting position at which the silicon wafer is supported upon being heated. Such a slip within the wafer may cause device malfunctions such as leakage, and therefore, various measures have been developed for preventing the occurrence of slip and diffusion within the silicon wafer. A technique of controlling slip diffusion with oxygen precipitates residing within a CZ wafer has been developed as one example of such measures. As can be appreciated from the above descriptions, oxygen precipitates may be used to control slip diffusion in addition to functioning as a gettering site (e.g., see K. Yasutake, M. Umeno, and H. Kawabe, Applied Physics Letters, 37, 789, 1980).

As is described above, oxygen precipitates are necessary for ensuring reliability and a high production yield of the silicon device. However, with the growing trend toward device miniaturization and reduction of the processing temperature, it is becoming difficult to realize adequate oxygen precipitation during a heating process. In turn, device performance may be degraded and the production yield may be decreased due to impurities residing within the wafer and slip occurring within the wafer. Accordingly, techniques are in demand for efficiently generating oxygen precipitates within a wafer in a heating process with reduced processing temperature.

SUMMARY OF THE INVENTION

According to one embodiment of the present invention, a technique is provided involving irradiating laser on a silicon wafer while heat-processing the silicon wafer, and increasing/decreasing the density of oxygen precipitates within the silicon wafer by adjusting the irradiation intensity of the laser (i.e., amount of heat irradiated on a unit area per time unit) and/or the heating temperature of the heating process.

According to one specific embodiment of the present invention, a wafer processing method is provided that involves:

heating a silicon wafer containing oxygen and irradiating an infrared ray having a wavelength within a range of 7-25 μm on the silicon wafer; and controlling formation of oxygen precipitates within the silicon wafer by selectively setting the heating temperature for heating the silicon wafer and the irradiation intensity of the infrared ray.

The wafer processing method according to a preferred embodiment involves:

setting the irradiation intensity of the infrared ray to a constant intensity;

increasing the oxygen precipitates within the silicon wafer by heating the silicon wafer to a first temperature and irradiating the infrared ray at the constant intensity; and suppressing the formation of the oxygen precipitates within the silicon wafer by heating the silicon wafer to a second temperature that is higher than the first temperature and irradiating the infrared ray at the constant intensity.

The wafer processing method according to another preferred embodiment involves:

setting the heating temperature for heating the silicon wafer to a constant temperature;

increasing the oxygen precipitates within the silicon wafer by heating the silicon wafer at the constant temperature and irradiating the infrared ray at a first intensity; and suppressing the formation of the oxygen precipitates by heating the silicon wafer at the constant temperature and irradiating the infrared ray at a second intensity that is higher than the first intensity.

The wafer processing method according to another preferred embodiment involves:

forming initial oxygen precipitates having dimensions on the order of 10 nm at a density of at least $1 \times 10^7/cm^3$ within the silicon wafer before the heating and irradiating step.

The wafer processing method according to another preferred embodiment involves:

scanning the infrared ray on an arbitrary point on the silicon wafer.

According to another specific embodiment of the present invention, a semiconductor device manufacturing method is provided that involves using the silicon wafer that is processed by the wafer processing method according to an embodiment of the present invention to manufacture a semiconductor device. According to another specific embodiment of the present invention, a wafer processing apparatus is provided that is configured to perform the wafer processing method according to an embodiment of the present invention.

According to an aspect of the present invention, a silicon wafer having an oxygen precipitate density suitable for a corresponding device may be realized through simple procedures, and in turn, reliability of the device may be improved. According to another aspect of the present invention, a device with high yield and high performance may be manufactured at a relatively low cost.

DESCRIPTION OF THE PREFERRED EMBODIMENTS

In the following, preferred embodiments of the present invention are described with reference to the accompanying drawings.

It is noted that inventors of the present invention have discovered that oxygen precipitation may be effectively suppressed in a device active region of a silicon wafer surface layer by irradiating an infrared ray with a wavelength of 7-25 μm while heating the silicon wafer.

The inventors of the present invention have also discovered that by selectively setting the irradiation intensity of the infrared ray laser within the wavelength range of 7-25 μm and the heating temperature for heating the silicon wafer, oxygen precipitation within the silicon wafer may be induced in addition to being suppressed. In other words, opposite effects of inducing/suppressing oxygen precipitation may be realized by adjusting the irradiation intensity of infrared ray laser and/or the heating temperature of the silicon wafer.

The underlying mechanism for realizing such effects is believed to be based on a change in the oxygen concentration at the interface between the oxygen precipitate and the silicon matrix depending on the intensity of the irradiated infrared ray and/or the heating temperature of the silicon wafer, and a change in the flux of oxygen around the oxygen precipitate from a direction for inducing growth of oxygen precipitates to a direction for disassociating the oxygen and vice versa.

Figure 1A:
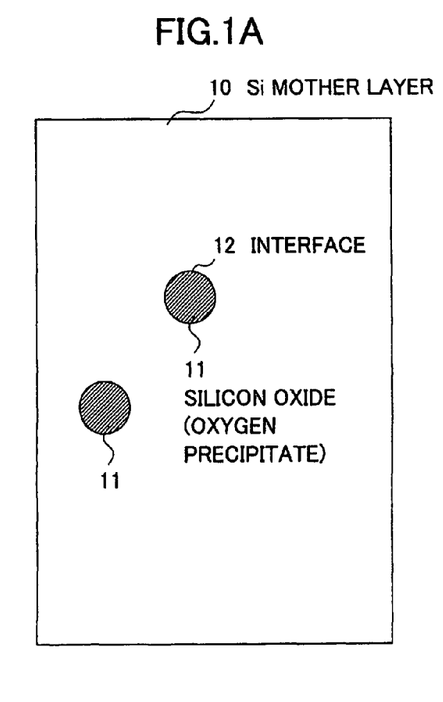
FIGS. 1A and 1B are diagrams showing the change in oxygen concentration at the interface between an oxygen precipitate and silicon.
Figure 1B:
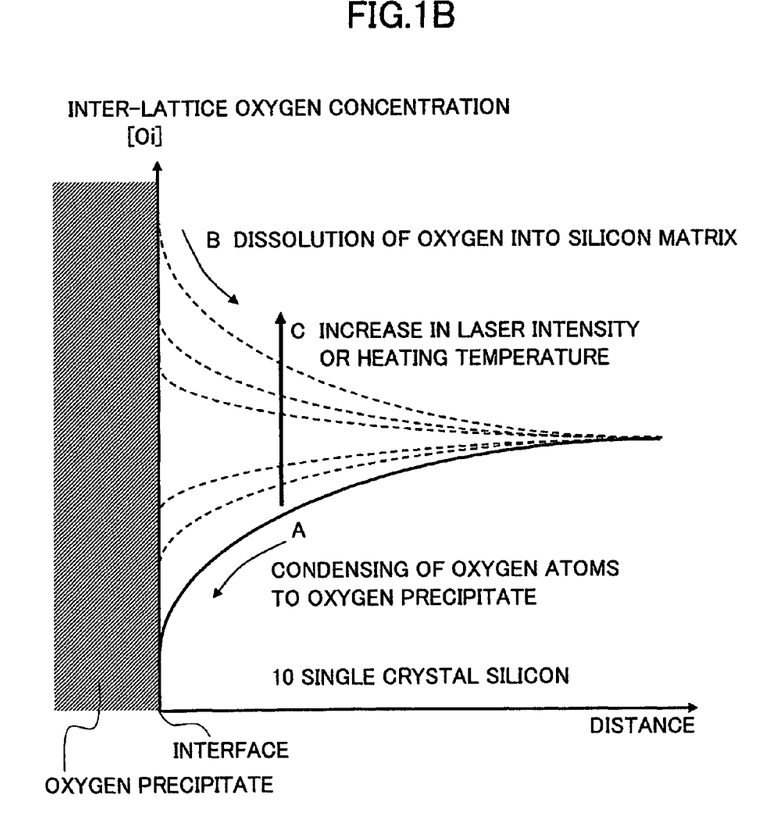

FIGS. 1A and 1B are diagrams showing the oxygen concentration change occurring at the interface between the oxygen precipitate and single crystal silicon. As is shown in FIG. 1A, silicon oxide precipitates (oxygen precipitates) 11 reside within a single crystal matrix (mother layer/silicon wafer) 10. A predetermined amount of oxygen atoms (O) corresponding to the saturated concentration at the melting point of silicon, for example, is included in the single crystal silicon 10. However, as is illustrated by the solid line in FIG. 1B, inter-lattice (interface) oxygen concentration (Oi) at an interface 12 with an oxygen precipitate 11 (oxygen precipitate/silicon matrix interface) is lower than the oxygen concentration at the mother silicon layer 10. This is because the dissolved oxygen around the oxygen precipitate 11 area is consumed during formation of the oxygen precipitates 11.

In this case, an oxygen flux flowing in the direction from the higher oxygen concentration side to the lower oxygen concentration side (i.e., toward the oxygen precipitate 11 side) is generated as is indicated by arrow A in FIG. 1B upon irradiating infrared ray laser on the silicon layer 10 while heat-processing the silicon layer 10 so that growth of the oxygen precipitates 11 is induced.

On the other hand, it is noted that diffusion of oxygen atoms dissolved in the silicon matrix is accelerated in response to the irradiation of infrared ray laser so that the interface oxygen concentration may be increased as is illustrated by the dotted lines in FIG. 1B. The interface oxygen concentration increase by the irradiation of infrared ray laser is described in detail below. When the intensity of laser irradiation exceeds a predetermined level, the oxygen concentration at the interface 12 becomes higher than the concentration of oxygen dissolved in the silicon matrix 10. In such a case, an oxygen flux flowing toward the silicon matrix 10 from the oxygen precipitate 11 side is generated to cause the dissolution of the oxygen precipitates 11. In this way, the amount of oxygen precipitates 11 may be reduced, such an effect being interpreted as the suppression of oxygen precipitation.

As can be appreciated from the above descriptions, formation of the oxygen precipitates 11 may be induced or suppressed depending on the oxygen flux. Generally, a flux is represented by a product of a diffusion coefficient and a concentration gradient. By irradiating infrared ray laser, the diffusion of silicon atoms dissolved in silicon is accelerated so that the diffusion coefficient of oxygen is increased. As is illustrated by the dotted lines in FIG. 1B, a flux in the direction for inducing the formation of the oxygen precipitates 11 is generated in a case where the concentration gradient slopes down to the left (i.e., the oxygen concentration at the interface 12 side is lower than that within the silicon matrix), and a flux in the direction for suppressing the formation of the oxygen precipitates 11 is generated in a case where the concentration gradient slopes down to the right (i.e., the oxygen concentration inter face 12 side is higher than that within the silicon matrix).

It is noted that in an alternative embodiment, the increase/decrease of the interface oxygen concentration may be controlled by adjusting the irradiation time of the infrared ray laser rather than the irradiation intensity of the infrared laser as is described above. However, controlling the interface oxygen concentration by adjusting the infrared ray irradiation time may require more processing time compared to the case of adjusting the infrared ray irradiation intensity, and thereby, oxygen precipitation may be induced/suppressed more efficiently through adjusting the infrared ray irradiation intensity.

Also, in another alternative embodiment, the infrared ray irradiation intensity may be maintained constant and the heating temperature may be adjusted to induce/suppress formation of the oxygen precipitates 11. Specifically, the oxygen concentration at an interface between an oxide film and silicon is known to increase in response to an increase in temperature (e.g., see T. Abe and H. Yamada-Kaneta, Journal of Applied Physics, 96 (2004) 4143.), and thereby, the direction of oxygen flux may be changed through adjusting the heating temperature of the heating process while irradiating the infrared ray laser at a fixed intensity.

For example, as is described in detail below, in a case where the intensity of laser is 100 mW/cm$^2$, oxygen precipitation is induced when the heating temperature is below 1200° C., and oxygen precipitation is suppressed when the heating temperature is greater than or equal to 1200° C. It is noted that the boundary temperature at which oxygen precipitation is switched from being induced to being suppressed may be changed by adjusting the laser irradiation intensity and the laser irradiation time, for example. In other words, one or more of the parameters described above may be selectively adjusted to efficiently form oxygen precipitates at a desired location of a wafer, or to dissolve the oxygen precipitates.

Figure 2:
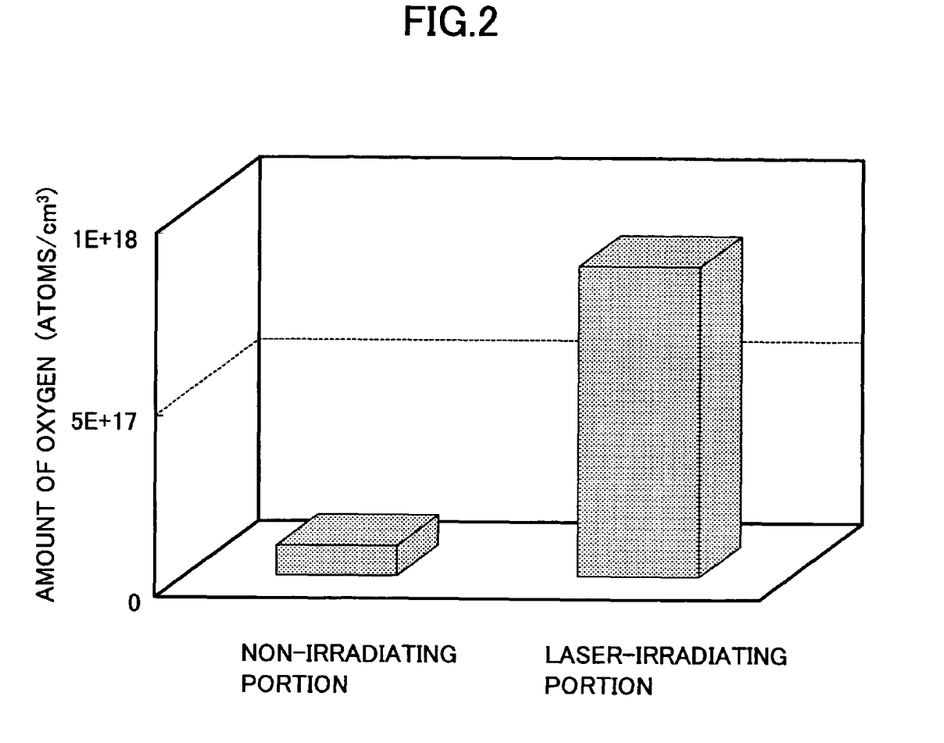
FIG. 2 is a graph showing a difference in oxygen precipitation amounts between a laser-irradiating portion and a non-irradiating portion of a silicon wafer that is heated and irradiated with laser.

FIG. 2 is a graph illustrating an effect of inducing formation of oxygen precipitates by irradiating infrared ray laser on a silicon wafer. In the illustrated example, a silicon wafer sample is heated for 16 hours at a heating temperature of 1000° C. The silicon wafer includes an irradiating portion that is arranged to be irradiated with laser and a non-irradiating portion that is not irradiated with laser. While heating the silicon wafer sample, an infrared ray laser with a wavelength of 9 μm, and an irradiation intensity of 100 mW/cm$^2$ is irradiated on the irradiating portion of the wafer sample. FIG. 2 represents data obtained by measuring the amount of oxygen precipitates (atoms/cm$^3$) through the FT-IR method using a Fourier transform infrared spectrum photometer after performing such a heating/laser irradiating process as is described above. The amount of oxygen precipitates is represented by the amount of oxygen atoms (O) included in oxide silicon. It is noted that a large amount of oxygen precipitates signifies that a large amount of oxygen precipitates reside within the silicon wafer sample.

In the case where the heating temperature is set to 1000° C., the amount of oxygen precipitates within the irradiating portion of the silicon wafer sample is about ten times greater than the amount of oxygen precipitates within the non-irradiating portion. As can be appreciated from the illustrated example of FIG. 2, precipitation of oxide silicon may be induced by irradiating infrared ray laser under the above-described conditions. It is noted that in the example of FIG. 2, the silicon wafer sample is heated at a temperature of 800° C. for four hours before performing the above heating/laser irradiating process in order to create the nuclei of the oxygen precipitates (e.g., initial oxygen precipitates with dimensions of approximately 10 nm). Further, it is noted that the density of the initial oxygen precipitates in this case is preferably arranged to be at least 1×10$^7$/cm$^3$.

It is noted that when the amount of oxygen precipitates is too large, relocation of the oxygen precipitates within the wafer may occur. Therefore, the amount of oxygen precipitates formed within the wafer has to be adjusted to a suitable amount. According to an embodiment of the present invention, this may be realized by adjusting the laser irradiation time, the laser irradiation intensity, and/or the heating temperature.

Figure 3:
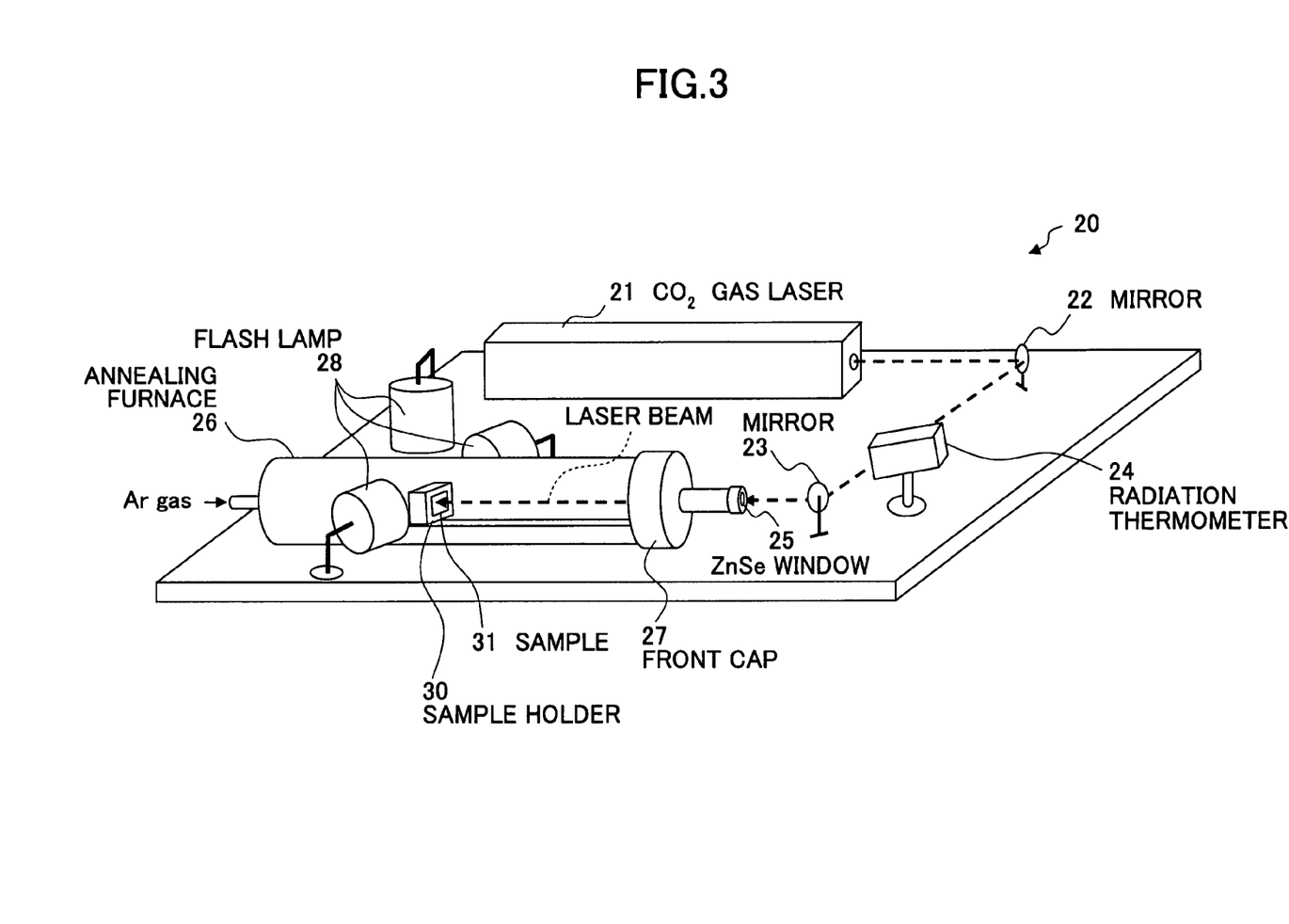
FIG. 3 is a diagram showing a configuration of a wafer processing apparatus that is configured to perform the heating/laser irradiating process on the silicon wafer to obtain the oxygen precipitation amount measurements shown in FIG. 2.

FIG. 3 is a diagram showing a configuration of a processing apparatus 20 that is configured to perform a heating/laser irradiating process on a silicon wafer sample. For example, the silicon wafer sample from which the measurement data shown in FIG. 2 is obtained may be processed by the processing apparatus 20 beforehand. The processing apparatus 20 shown in this drawing includes a carbon dioxide gas laser 21, an annealing furnace 26 for heating a silicon wafer, and a sample holder 30 for holding the silicon wafer (sample 31) within the annealing furnace 26. Laser irradiated from the carbon dioxide gas laser 21 is guided to the annealing furnace 26 by mirrors 22 and 23 and is incident on the sample 31 that is held within the annealing furnace 26 by the sample holder 30 via a ZnSe window 25 arranged at a front cap 27 of the annealing furnace 26. In the illustrated example, a radiation thermometer 24 is arranged between the mirrors 22 and 23. Also, a flash lamp 28 as a heat source is arranged near the annealing furnace 26. The heating temperature within the annealing furnace 26 may be adjusted by adjusting the intensity of the flash lamp 28, for example. However, it is noted that the heat source may be any temperature-adjustable heating means for heat-processing the silicon wafer. In the present example, argon (Ar) gas is supplied to the annealing furnace 26, and laser irradiation is performed within a Ar/O$_2$ gas atmosphere.

Figure 4A:
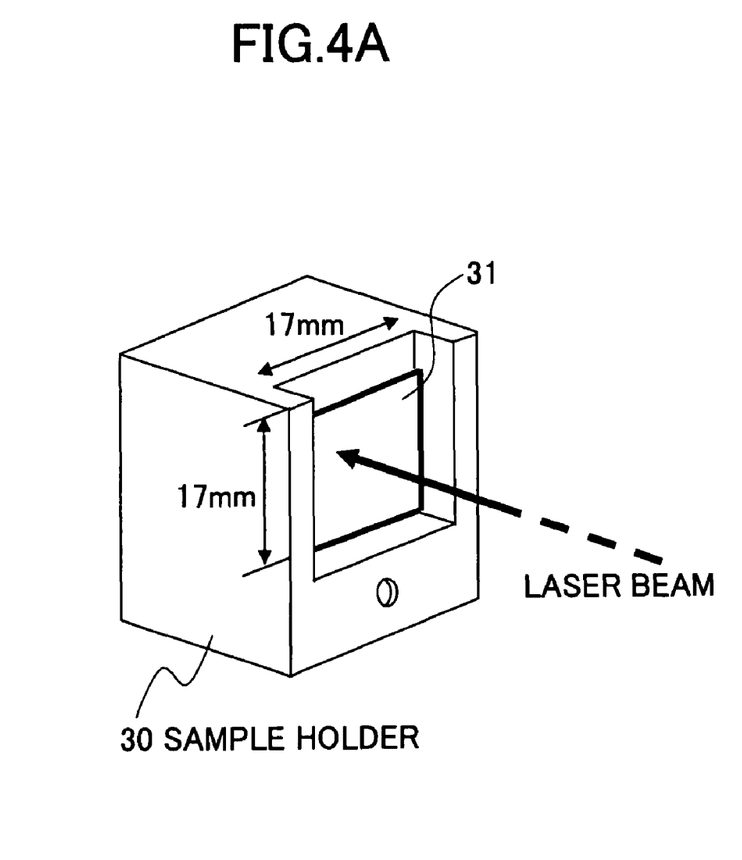
FIGS. 4A and 4B are diagrams respectively showing a sample holder of the wafer processing apparatus of FIG. 3 and a silicon wafer sample held by the sample holder.
Figure 4B:
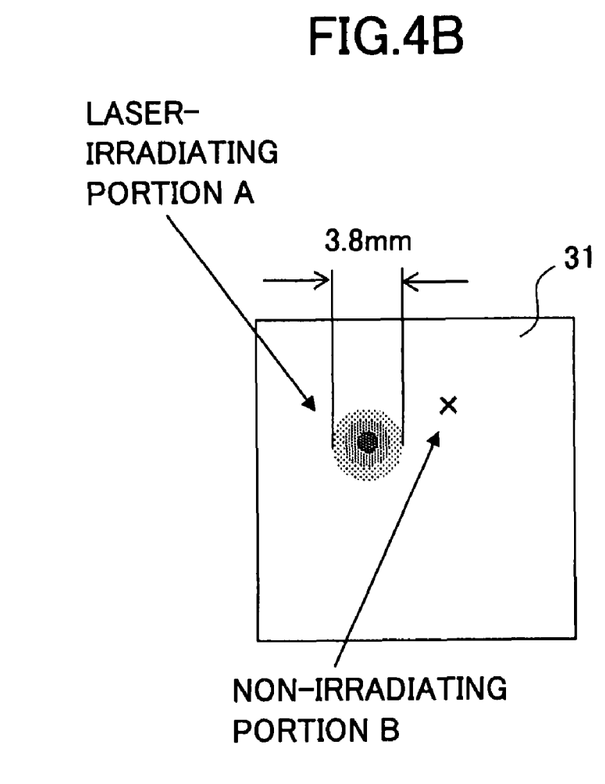

FIG. 4A is a diagram showing the sample holder 30 of the processing apparatus 20 shown in FIG. 3 holding the sample 31, and FIG. 4B is a diagram showing a laser irradiating portion A and a non-irradiating portion B of the sample 31. According to the present example, the sample 31 has dimensions of 17 mm×17 mm, and laser with a wavelength of 9 μm, a beam diameter of 3.8 mm, and a laser intensity of 100 mW/cm$^2$ is irradiated on the laser irradiating portion A of the sample 31. The non-irradiating portion B is located away from the laser irradiating portion A by a certain distance. The graph of FIG. 2 shows exemplary measurement data representing the amount of oxygen precipitates measured at the laser irradiating portion A and the non-irradiating portion B of the sample 31 shown in FIG. 4B.

It is noted that the silicon wafer may be heated by the irradiation of infrared ray laser. Therefore, it may be assumed that the effect of inducing oxygen precipitation as is shown in FIG. 2 may simply be the result of temperature increase in the silicon wafer sample rather than the irradiation of infrared ray laser. However, it may be appreciated from a temperature distribution measurement of the silicon wafer heated through laser irradiation that the effect of FIG. 2 is not merely the result of the temperature increase in the silicon wafer.

Figure 5:
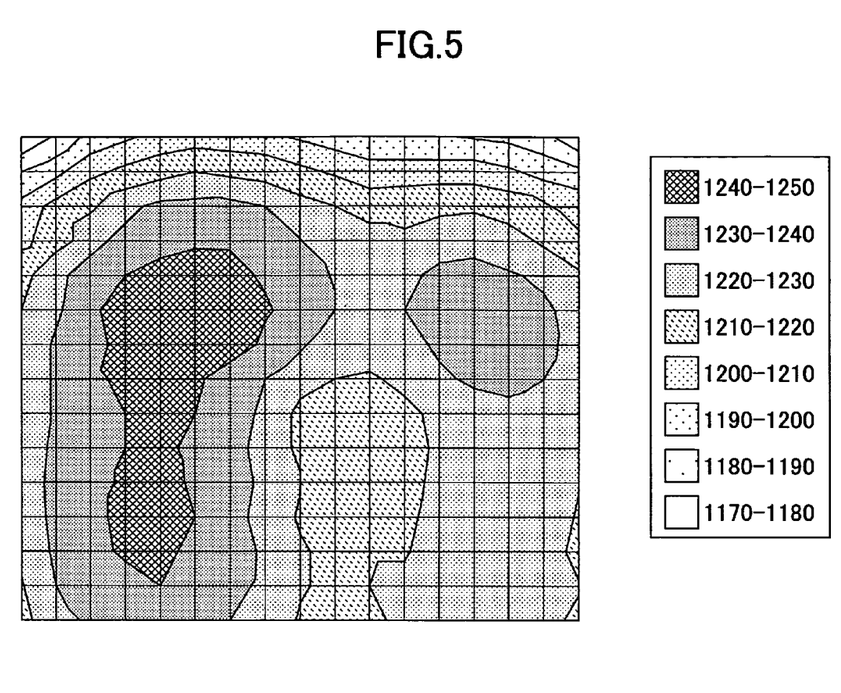
FIG. 5 is a diagram showing a temperature distribution of the silicon wafer that is heated and irradiated with laser.

FIG. 5 is a diagram showing an exemplary measurement of the temperature distribution of the sample 31 shown in FIG. 4B (with dimensions 17 mm×17 mm) that is heated by irradiating laser on the laser irradiating portion A, the temperature distribution being measured using a radiant temperature gauge. As can be appreciated from the measurement data of FIG. 5, upon heating the silicon wafer sample 31 to at least 1000° C. and irradiating laser on a predetermined portion of the silicon wafer sample 31, the overall temperature difference within the silicon wafer sample 31 is merely around 20-30° C., and the temperature difference between the laser irradiating portion A and the non-irradiating portion B is no more than 20° C. Thus, it may be confirmed from the temperature distribution measurement of FIG. 5 that oxygen precipitation is induced as is illustrated in FIG. 2 by the irradiation of infrared ray laser and such an effect is not merely the result of a temperature increase of the silicon wafer.

As can be appreciated from the above descriptions, by irradiating infrared ray laser at a heating temperature of 1000° C., diffusion of dissolved oxygen in the silicon matrix may be excited, and an oxygen flux flowing toward the interface 12 between the oxygen precipitates 11 and the silicon matrix may be generated.

Figure 6:
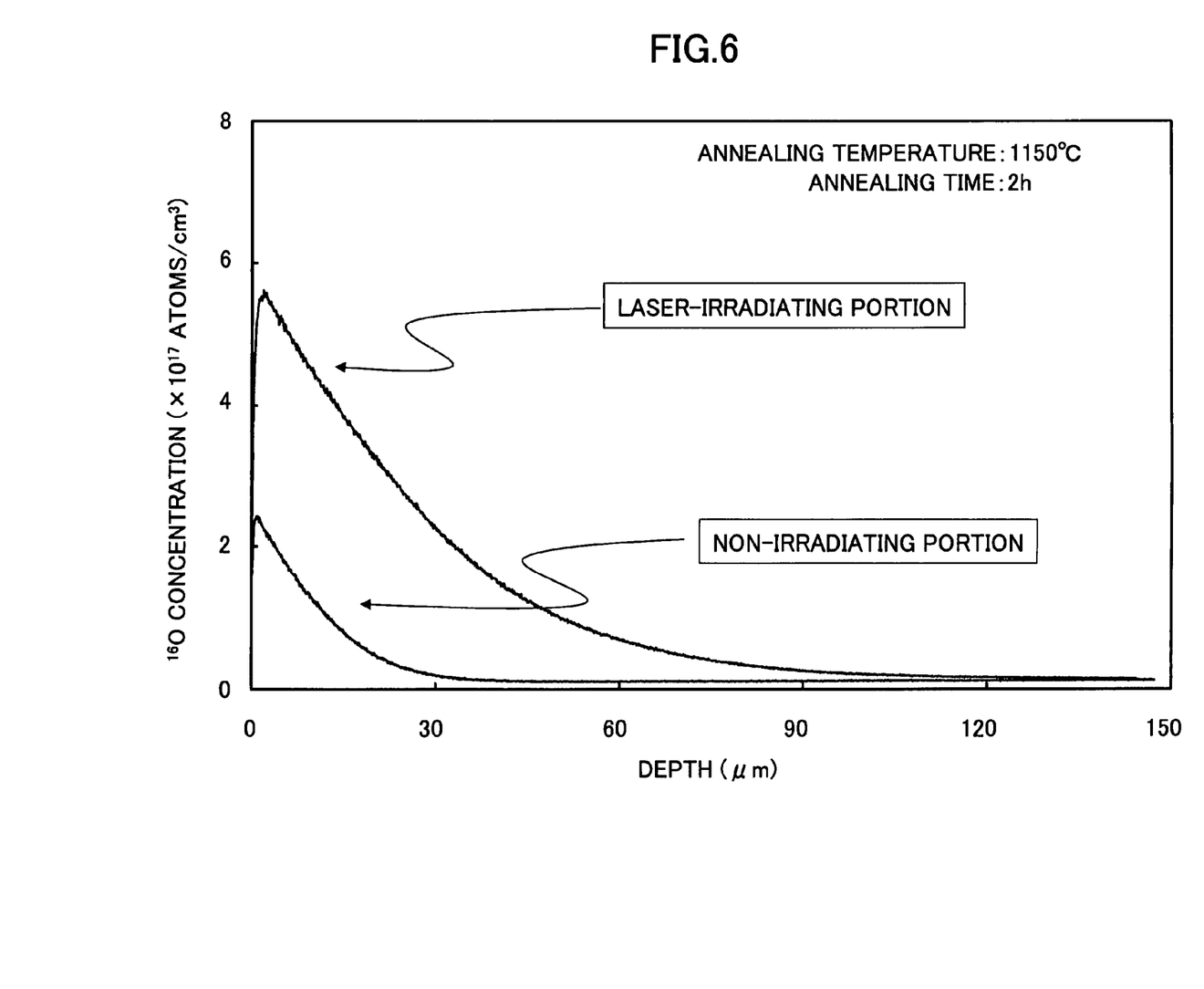
FIG. 6 is a graph showing oxygen concentration profiles in the depth direction of the laser-irradiating portion and the non-irradiating portion of the silicon wafer that is heated to a temperature of 1150° C. and irradiated with infrared ray laser.

FIG. 6 is a graph showing oxygen concentration profiles in the depth direction of the laser irradiating portion A and the non-irradiating portion B of the silicon wafer sample 31 in a case where a predetermined amount of oxygen is diffused from the sample surface to an FZ crystal after which oxidation heat processing is performed in a Ar/$O_2$ gas atmosphere while irradiating laser with a wavelength of 9 μm. In the present example, the sample is heated at a heating temperature of 1150° C. for two hours.

Also, in the present example, the oxygen concentration within the sample is measured using the Secondary Ion Mass Spectrometry (SIMS) technique. Since the sample is heated in an Ar/$O_2$ gas atmosphere, a silicon oxide film is formed on the surface of the sample. This silicon oxide film may be regarded as a substantial equivalent of the oxygen precipitate 11. In turn, the oxide film/silicon interface may be regarded as the equivalent of the oxygen precipitate/silicon matrix interface 12 of FIGS. 1A and 1B.

It the case where laser is irradiated at a heating temperature of 1150° C., the oxygen concentration of the oxide film/silicon interface at the irradiating portion A is increased to approximately three times the interface oxygen concentration at the non-irradiating portion. Thus, it may be appreciated from FIG. 6 that the oxygen concentration at the oxide film/silicon interface may be increased by irradiating infrared ray laser thereon. This is believed to be the result of the generation of the oxygen flux flowing in the direction toward the oxygen precipitate 11 as is illustrated in FIG. 1B.

As can be appreciated from the above descriptions, in the case of heat-processing a silicon wafer at a heating temperature below 1200° C., oxygen precipitates may be generated within the silicon wafer by irradiating laser thereon.

Figure 7A:
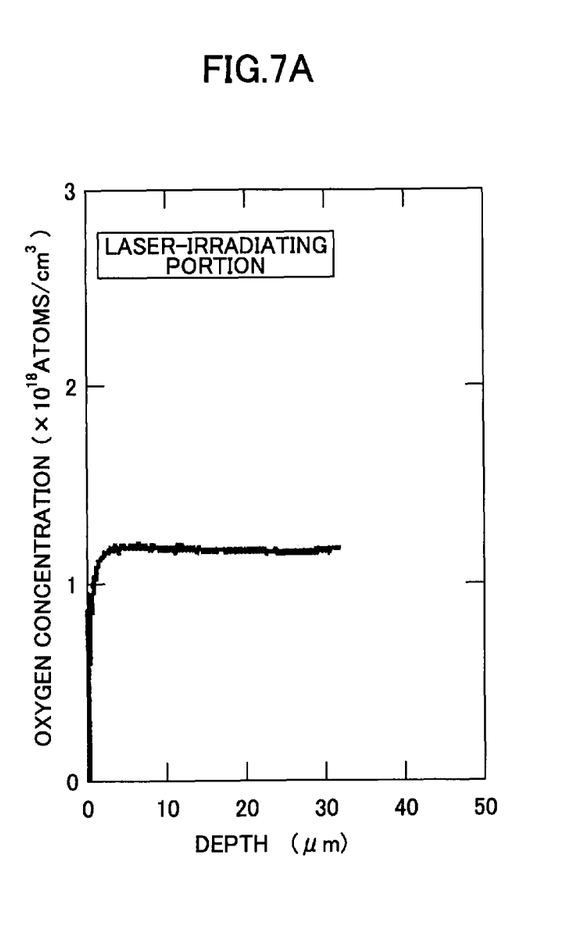
FIGS. 7A and 7B are graphs showing oxygen concentration profiles in the depth direction of the laser-irradiating portion and the non-irradiating portion of the silicon wafer that is heated to a temperature of 1200° C. and irradiated with infrared ray laser.
Figure 7B:
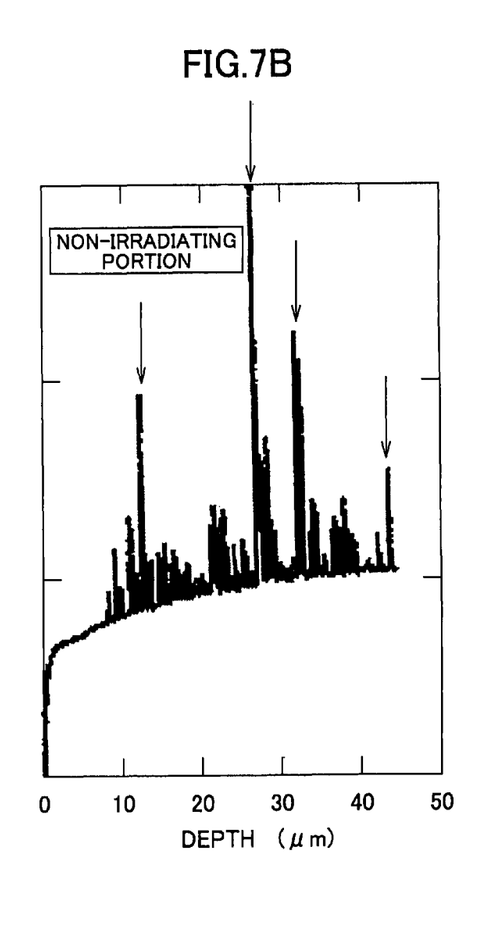

On the other hand, it is noted that the amount of oxygen precipitates residing within a silicon wafer may be reduced in a case where the silicon wafer is heated to a temperature that is greater than or equal to 1200° C. and infrared ray laser is irradiated at an irradiation intensity of 100 mW/$cm^2$. FIGS. 7A and 7B are graphs showing oxygen concentration profiles in the depth direction of the laser irradiating portion A and the non-irradiating portion B of the silicon wafer sample 31 in a case where the silicon wafer sample 31 is heated to a temperature of 1200° C. for one hour and laser with a wavelength of 9 μm, an intensity of 25 W, and a beam diameter of 6 mm is irradiated using the processing apparatus shown in FIGS. 3, 4A and 4B, the profiles being obtained using the SIMS technique.

FIG. 7A shows the oxygen concentration profile at the infrared ray irradiating portion A; and FIG. 7B shows the oxygen concentration profile at the non-irradiating portion B. Since the oxygen concentration at the oxygen precipitate 11 is higher than that at the silicon matrix, the depth profile based on the SIMS measurement as is shown in FIG. 7B has oxygen spikes (see arrows in FIG. 7B). Specifically, the spikes are present over a depth range of 8-45 μm of the non-irradiating portion B. In contrast, the oxygen spikes are not found in the SIMS profile of FIG. 7A.

It is noted that the area in which oxygen precipitates are not present is referred to as Denuded Zone (DZ). The depth (width) of the DZ may be controlled by the oxygen concentration within silicon, the heating temperature, and the heating time in a case where laser is not irradiated. According to the present embodiment, the depth (width) of the DZ may be controlled by the irradiation intensity and irradiation time of infrared ray laser in addition to the above parameters.

Figure 8:
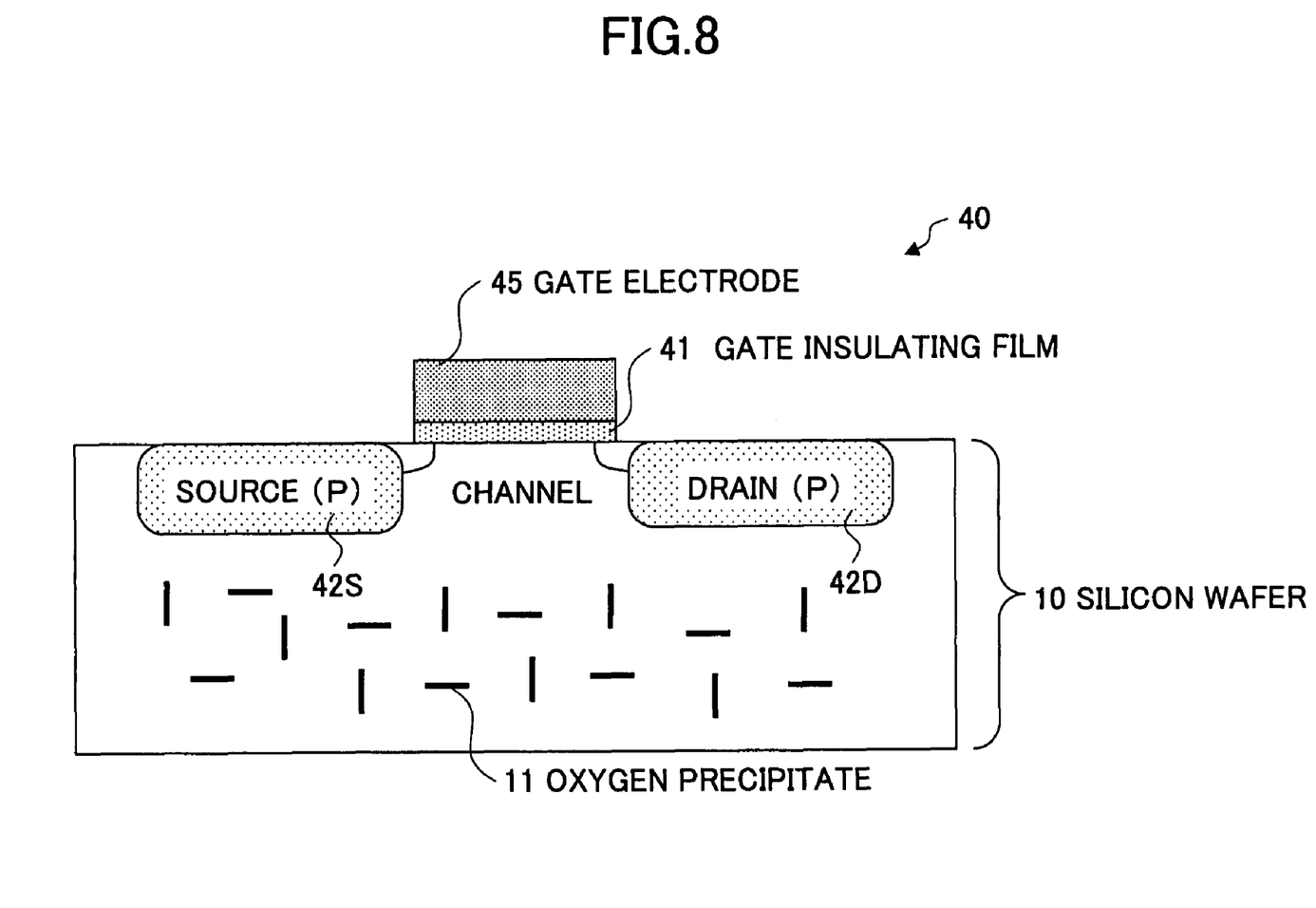
FIG. 8 is a diagram showing a configuration of a semiconductor device that is manufactured from a silicon wafer that is processed by the wafer processing method according to an embodiment of the present invention.

FIG. 8 is a diagram showing a semiconductor device 40 that is manufactured using a silicon wafer that is heated and irradiated with laser according to the wafer processing method of the present embodiment. In the present example, an active layer close to the surface of the silicon wafer 10 corresponds to a DZ layer, and oxygen precipitates reside within a deeper layer with respect to the DZ layer as a gettering site. The active layer includes source/drain impurity diffusion regions 42S/42D arranged opposite each other and a channel region that is arranged in between the source/drain impurity diffusion regions 42S/42D. It is noted that a gate insulating film 41 is arranged on the channel region, and a gate electrode is arranged on the gate insulating film 41.

It is noted that conventionally, when silicon crystals are grown by the CZ method according to the 0.35 μm design rule, defects such as voids are created during crystal growth and pressure resistance of the oxide film is degraded owing to defects occurring on the surface of the silicon wafer. Accordingly, an as-grown (untreated) CZ wafer cannot be used in the latest devices employing the 0.35 μm design rule, and a wafer that is heat-processed beforehand in order to remove the void defects on the wafer surface is used to this day. Such a wafer is referred to as annealed wafer.

A typical heating process for creating the annealed wafer involves heating a wafer to a heating temperature of 1100° C. for a heating time of 1-4 hours. It is noted that oxygen precipitates are created within the wafer upon performing such a heating process for removing the voids. Accordingly, by irradiating infrared ray laser on the wafer upon heat-processing the wafer for removing voids, oxygen precipitates may be efficiently created within the wafer.

Alternatively, infrared ray laser may be irradiated during the semiconductor device manufacturing process. In this case, the infrared ray irradiation is preferably performed before forming a gate insulating film since the infrared ray laser may be prevented from reaching into the silicon wafer when metal films such as wiring are deposited thereon.

Also, after the silicon wafer is heated to a heating temperature below 1200° C. to induce oxygen precipitation, the wafer may be heated to a temperature that is greater than or equal to 1200° C., and the irradiating intensity and/or irradiating time may be adjusted to irradiate infrared ray laser on a predetermined location of the wafer in order to reduce the amount of oxygen precipitates at the DZ of the wafer surface, for example. In this way, oxygen precipitates within the device active layer may be reduced. It is particularly noted that some semiconductor device manufacturing processes may involve performing a high-temperature heating process after performing a low-temperature heating process. Therefore, oxygen precipitation may be efficiently controlled by changing the laser irradiating intensity during such heating processes.

In the following, a method of irradiating infrared ray laser according to an embodiment of the present invention is described. It is noted that in the illustrated example, the carbon dioxide gas laser as is described in relation to FIG. 3 is used as an infrared ray laser source. The carbon dioxide gas laser may be an all-purpose laser that is adapted to irradiate infrared rays on a front face of a 300 mm-wafer, for example. An infrared ray-permeable entrance window (e.g., ZnSe window 25) may be used to enable an infrared ray beam to enter the wafer furnace, and the irradiation area may be rate-controlled by the entrance window. In this case, an arbitrary point on the wafer surface may be irradiated with the infrared ray by scanning the infrared ray on the wafer surface.

It is noted that slip occurrence may be observed after the amount of oxygen precipitates is measured according to the FT-IR method and, if the density of oxygen precipitates is at least $10^9/cm^3$, slip occurring from the wafer supporting position may be prevented from penetrating through the wafer surface.

It is noted that in the above-described embodiments of the present invention, the heating process is performed at a temperature of 1000° C. or 1200° C. However, the present invention is not limited to these embodiments, and the heating temperature may be set to any temperature that induces diffusion of oxygen atoms within a silicon crystal. Specifically, the heating temperature may be set to a suitable temperature that is greater than or equal to 200° C. Also, it is noted that the heating time is preferably at least 10 seconds in order to efficiently realize the oxygen precipitation suppressing/inducing effects as is described above. Also, according to logical analysis, by increasing the laser intensity to an upper limit of a practical laser irradiation intensity range, the heating temperature may be lowered to around room temperature.

Although the present invention is shown and described with respect to certain preferred embodiments, it is obvious that equivalents and modifications will occur to others skilled in the art upon reading and understanding the specification. The present invention includes all such equivalents and modifications, and is limited only by the scope of the claims.

For example, in the above-described embodiments of the present invention, infrared ray laser with a wavelength of 9 μm is used. However, the present invention is not limited to such an embodiment, and the infrared ray laser may have any wavelength within the range of 7-25 μm. Also, according to one embodiment, the heating temperature may be maintained constant while changing the laser irradiation intensity in order to selectively control (induce/suppress) oxygen precipitation within a silicon wafer. In this case, the silicon wafer may be heated to the constant temperature and laser with a first irradiation intensity may be irradiated on the silicon wafer to induce oxygen precipitation within the silicon wafer, and then, while maintaining the heating temperature of the silicon wafer to the constant temperature, laser may be irradiated on the silicon wager at a second irradiation intensity that is higher than the first irradiation intensity to suppress oxygen precipitation within the silicon wafer.

The present application is based on and claims the benefit of the earlier filing date of Japanese Patent Application No. 2006-038547 filed on Feb. 15, 2006, the entire contents of which are hereby incorporated by reference.

What is claimed is:

1. A wafer processing method comprising:
   heating a silicon wafer containing oxygen by a flash lamp; and
   irradiating an infrared ray laser having a wavelength within a range of 7-25 μm on the silicon wafer, while the silicon wafer is heated by the flash lamp, to form oxygen precipitates within the silicon wafer.

2. The wafer processing method as claimed in claim 1, further comprising:
   setting an irradiation intensity of the infrared ray laser to a constant intensity;
   increasing the oxygen precipitates within the silicon wafer by heating the silicon wafer to a first temperature and irradiating the infrared ray laser at the constant intensity; and
   suppressing the formation of the oxygen precipitates within the silicon wafer by heating the silicon wafer to a second temperature which second temperature is higher than the first temperature and irradiating the infrared ray laser at the constant intensity.

3. The wafer processing method as claimed in claim 1, further comprising:
   forming initial oxygen precipitates having dimensions on the order of 10 nm at a density of at least $1 \times 10^7/cm^3$ within the silicon wafer before the heating and the irradiating.

4. The wafer processing method as claimed in claim 1, further comprising:
   scanning the infrared ray laser on an arbitrary point on the silicon wafer.

5. A semiconductor device manufacturing method comprising:
   heating a silicon wafer containing oxygen by a flash lamp;
   irradiating an infrared ray laser having a wavelength within a range of 7-25 μm on the silicon wafer, while the silicon wafer is heated by the flash lamp, to form oxygen precipitates within the silicon wafer; and
   forming a semiconductor element on the silicon wafer.

6. The semiconductor device manufacturing method as claimed in claim 5, wherein
   the heating and irradiating are performed before the forming.

7. The semiconductor device manufacturing method as claimed in claim 5, wherein
   the forming includes forming a gate insulating film; and
   the heating and the irradiating are performed before the gate insulating film is formed.

8. The semiconductor device manufacturing method as claimed in claim 5, further comprising: setting an irradiation intensity of the infrared ray laser to a constant intensity; increasing the oxygen precipitates within the silicon wafer by heating the silicon wafer to a first temperature and irradiating the infrared ray laser at the constant intensity; and suppressing the formation of the oxygen precipitates within the silicon wafer by heating the silicon wafer to a second temperature which second temperature is higher than the first temperature and irradiating the infrared ray laser at the constant intensity.

* * * * *